United States Patent
Chyan et al.

(10) Patent No.: US 7,247,554 B2
(45) Date of Patent: Jul. 24, 2007

(54) METHOD OF MAKING INTEGRATED CIRCUITS USING RUTHENIUM AND ITS OXIDES AS A CU DIFFUSION BARRIER

(75) Inventors: Oliver Chyan, Denton, TX (US); Thomas Ponnuswamy, Tualatin, OR (US)

(73) Assignee: University of North Texas, Denton, TX (US)

( * ) Notice: Subject to any disclaimer, the term of this patent is extended or adjusted under 35 U.S.C. 154(b) by 290 days.

(21) Appl. No.: 10/600,039

(22) Filed: Jun. 20, 2003

(65) Prior Publication Data

US 2004/0051117 A1    Mar. 18, 2004

Related U.S. Application Data

(60) Provisional application No. 60/393,204, filed on Jul. 2, 2002.

(51) Int. Cl.
*H01L 21/4763* (2006.01)
(52) U.S. Cl. ............... 438/622; 438/618; 438/637; 438/673; 438/700
(58) Field of Classification Search ........ 438/637–638, 438/672–676, 618–624; 257/758, 762
See application file for complete search history.

(56) References Cited

U.S. PATENT DOCUMENTS

| | | | | |
|---|---|---|---|---|
| 5,618,746 A | * | 4/1997 | Hwang | 438/3 |
| 5,637,533 A | * | 6/1997 | Choi | 438/643 |
| 6,057,232 A | * | 5/2000 | Lee | 438/658 |
| 6,319,832 B1 | * | 11/2001 | Uhlenbrock et al. | 438/681 |
| 6,441,492 B1 | | 8/2002 | Cunningham | |
| 6,624,513 B1 | * | 9/2003 | Iwasaki et al. | 257/753 |
| 6,664,186 B1 | * | 12/2003 | Callegari et al. | 438/681 |
| 6,713,373 B1 | * | 3/2004 | Omstead | 438/608 |
| 6,790,773 B1 | * | 9/2004 | Drewery et al. | 438/643 |
| 6,831,003 B1 | * | 12/2004 | Huang et al. | 438/627 |
| 6,831,033 B2 | * | 12/2004 | Yang et al. | 502/118 |
| 2003/0216036 A1 | * | 11/2003 | Ma | 438/637 |
| 2004/0238965 A1 | * | 12/2004 | Iwasaki et al. | 257/762 |
| 2004/0241321 A1 | * | 12/2004 | Ganguli et al. | 427/255.28 |

* cited by examiner

*Primary Examiner*—Dung A. Le
(74) *Attorney, Agent, or Firm*—Jackson Walker L.L.P.

(57) ABSTRACT

The present invention generally relates to methods used for fabricating integrated circuits ("ICs"), using Ruthenium ("Ru") and its oxides and/or Iridium ("Ir") and its oxides as the diffusion barrier to contain and control copper ("Cu") interconnects. The invention also covers ICs incorporating such materials in the diffusion barrier to contain and control the Cu interconnects. The present invention advantageously provides better integration and fabrication of advanced IC chips with sub-micron features.

9 Claims, 5 Drawing Sheets

METHOD OF MAKING INTEGRATED CIRCUITS USING RUTHENIUM AND ITS OXIDES AS A CU DIFFUSION BARRIER

CROSS REFERENCE TO RELATED APPLICATION

This application is related to U.S. provisional patent application No. 60/393,204, filed Jul. 2, 2002, entitled "METHOD OF USING MATERIALS BASED ON RUTHENIUM AND IRIDIUM AND THEIR OXIDES, AS A Cu DIFFUSION BARRIER, AND INTEGRATED CIRCUITS INCORPORATING SAME", the entire contents of which are incorporated herein by this reference. The Applicants hereby claim the benefits of this earlier pending provisional application under 35 U.S.C. Section 119(e).

TECHNICAL FIELD OF THE INVENTION

This invention generally relates to methods used for fabricating integrated circuits ("ICs"), specifically methods of using certain materials as the diffusion barrier to contain copper ("Cu") interconnects. The invention also covers ICs incorporating such materials in the diffusion barrier to contain the Cu interconnects. The present invention advantageously provides better integration and fabrication of advanced IC chips with sub-micron features.

BACKGROUND OF THE INVENTION

In the sub-100 nm generation of integrated circuits ("ICs"), it is anticipated that copper ("Cu") will replace aluminum as the new interconnect material due to its favorable electrical conductivity (1.67 $\mu\Omega.cm$ vs. 2.66 $\mu\Omega.cm$ of aluminum) and its superior resistance to electromigration. Additionally, improved electromigration resistance allows integrated circuits to operate at higher current densities and possibly at higher temperatures. IC chips fabricated with more conductive Cu interconnects and low-k dielectrics operate with less power and at significantly higher speed due to decreases in the interconnect RC coupling delay. The new dual-damascene patterning process coupling with chemical-mechanical planarization (CMP) significantly simplifies Cu interconnect routing and lowers manufacturing costs.

However, copper diffuses easily into active silicon devices and interlayer dielectrics ("ILD"), especially under electrical and thermal stresses resulting in deep level traps in the Si band gap. To prevent catastrophic contamination caused by Cu diffusion, diffusion barriers like tantalum ("Ta") and tantalum nitride ("TaN") are currently deposited in the damascene trench/via features by physical vapor deposition (PVD) to contain Cu interconnects. Since thin barrier layers of Ta (13.2 $\mu\Omega.cm$) and TaN (>200 $\mu\Omega.cm$) are too resistive to plate Cu directly, a continuous Cu-seeding layer (>7.5 nm) must be deposited over the Ta/TaN barrier to assure a good Cu electrofill.

The most challenging aspect of implementing Cu interconnects for advanced complementary metal-oxide-semiconductor ("CMOS") applications beyond the 100 nm mode is the increasing difficulty with the overall process integration. Shrinking dimensions demand an increasingly high-aspect-ratio of trench/via features that make PVD barrier/seed deposition and Cu electrofill more difficult. The space situation is most severe at the bottom metallization layer where the first connections to sub-100 nm transistor array are made. For the future 45–65 nm CMOS devices, the thickness of a functional diffusion barrier is limited to merely 5 nm at this crucial metal layer. The current Cu/Ta/TaN stack approach can not be scaled down to meet the future industry roadmap requirements. In addition, any discontinuities in the Cu seed layer, large overhang, or poor coverage on the lower sidewall can affect the Cu electroplating through an early pinch-off of the structure, resulting in a void defect being formed. Structural integrity concerns and adhesion issues of the barrier metal to the new ultra low-k dielectric are often mentioned as accompanying problems.

The present invention greatly reduces the overall integration difficulties by replacing the current Cu Seed/Ta/TaN trilayer barrier configuration with a directly Cu-plate-able barrier layer consisting of a combination of Ruthenium ("Ru") and Iridium ("Ir") and their conductive oxides Ruthenium Oxide ("$RuO_2$") and Iridium Oxide ("$IrO_2$"). The exact lateral chemical composition of this novel (Ru, $RuO_2$) and/or (Ir, $IrO_2$) diffusion barrier can be fine tuned to achieve strong adhesion between Cu/(Ru, $RuO_2$)/interlayer dielectrics. With the new directly Cu-plate-able diffusion barrier, the costly Cu-seed layer can be eliminated which will greatly decrease copper interconnect processing costs and further simplifying circuit design and promoting overall integration success.

BRIEF SUMMARY OF THE INVENTION

The present invention utilizes a novel directly Cu-plate-able diffusion barrier consisting of conductive Ru and/or $RuO_2$ and Ir and/or $IrO_2$ and their combinations, in single or multi-layers, to eliminate the additional Cu-seeding layer and provide strong interlayer adhesion between Cu/diffusion barrier/interlayer dielectrics. The present invention encompasses ICs made with said barrier materials.

DESCRIPTION OF THE PRIOR ART

In U.S. Pat. No. 6,441,492 to Cunningham, disclosure is made of an IC with a barrier layer preferably comprising at least one of rhodium, ruthenium or rhenium. However, Cunningham does not disclose or claim said element being applied in an atomic layer deposition process or in combination with Ir and its conductive oxide, and its superior interlayer adhesion characteristics, based on the Ru and/or $RuO_2$ and Ir and/or $IrO_2$ multi-layer composition.

DETAILED DESCRIPTION OF THE PRESENT INVENTION

Figure 1:
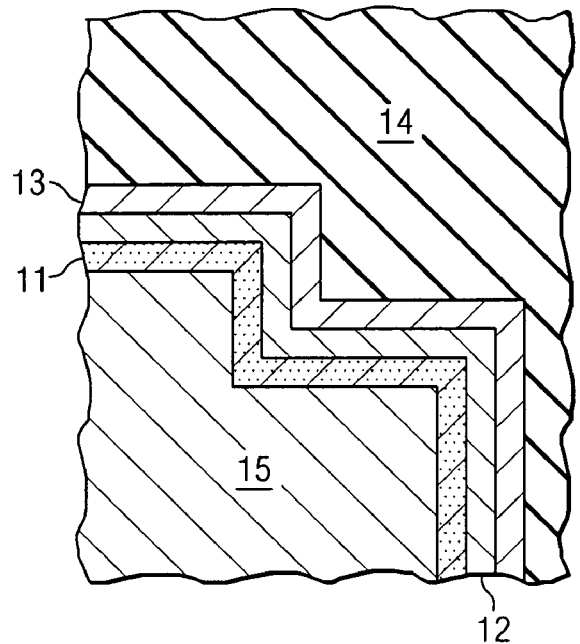
FIG. 1 illustrates the conventional use of Ta and TaN as a barrier material.

Ideal diffusion barriers should have good adhesion to both copper and interlayer dielectrics, in addition to affording a conductive Cu plating platform that is utilized for the bottom-up Cu electrofill of damascene features. FIG. 1 illustrates the conventional use of Ta and TaN as a barrier material in a portion of IC 10.

As can be seen therein, the Cu electrofill 15 is separated from the interlevel dielectric ("ILD") 14 by the Cu seed layer 11, the Ta layer 12 and a TaN layer 13.

Figure 3:
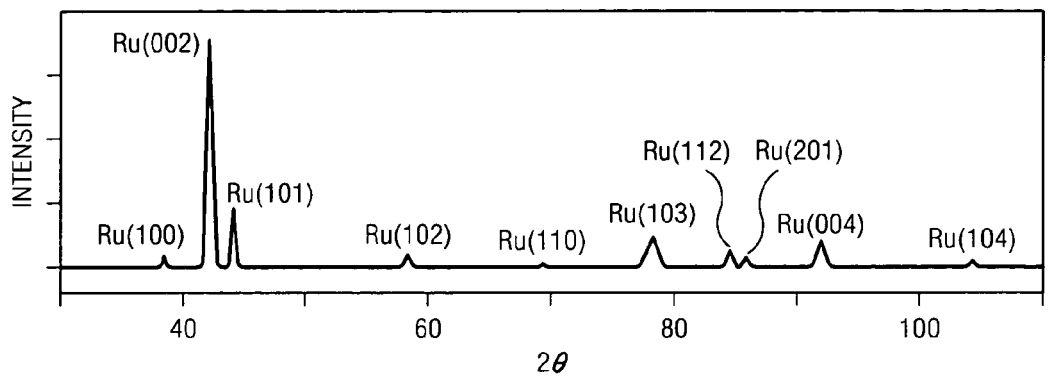
FIG. 3 is a graph illustrating the X-ray diffraction pattern of the Ru substrate.
Figure 4:
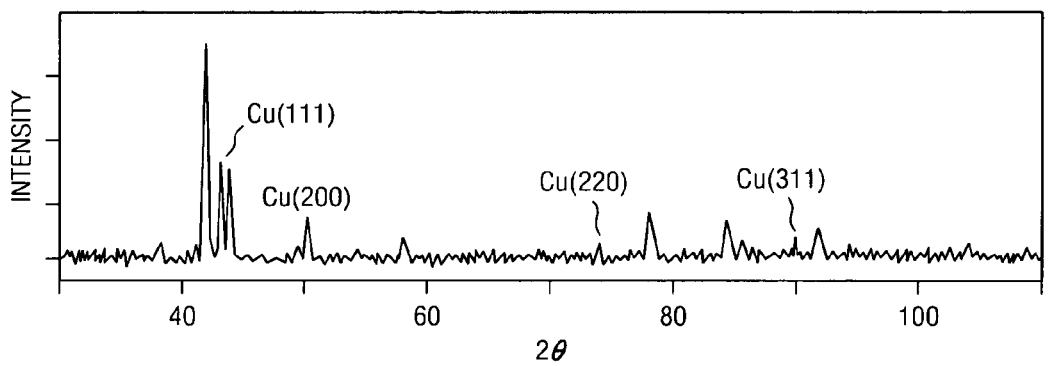
FIG. 4 is a graph illustrating the X-ray diffraction pattern between the Cu deposit and the Ru substrate at 25 degrees Celsius.
Figure 5:
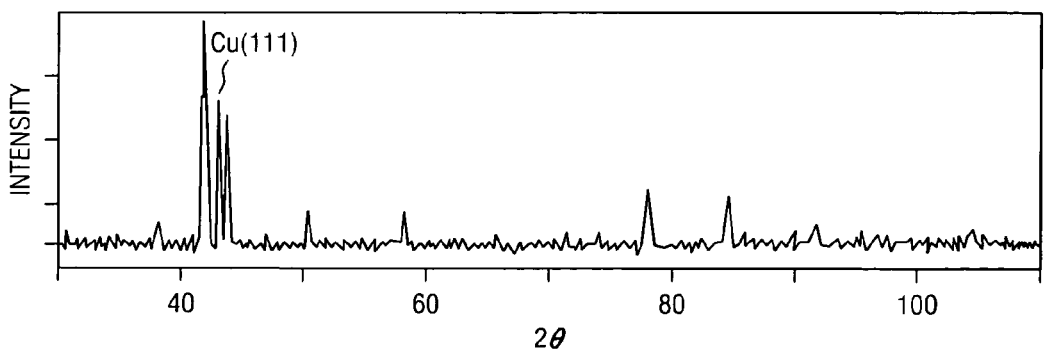
FIG. 5 is a graph illustrating the X-ray diffraction pattern between the Cu deposit and the Ru substrate at 800 degrees Celsius.

The present invention is an improvement over the conventional art. The present invention employs a Ru, and/or $RuO_2$ and Ir, and/or $IrO_2$ combination diffusion barrier material to replace the more resistive Ta/TaN barrier and eliminate the need for an additional costly Cu-seed layer. Ru is an air-stable transition metal of high melting point (2310° C.) that has nearly twice the electrical conductivity (7.6 $\mu\Omega$.cm) and thermal conductivity as Ta. Furthermore, Ru, like Ta, shows negligible solid solubility with Cu up to 900° C. based on the binary phase diagram and is therefore a good barrier candidate. Cu plates easily and exhibits excellent adhesion on Ru substrates. More importantly, as seen in FIGS. 3 to 5, X-ray diffraction ("XRD") patterns indicate no new phases or intermetallic compound formation between the Cu deposit and Ru substrate even after annealing at 800° C. The observed chemical stability of the Cu/Ru interface under high thermal stress underscores the potential of Ru as an effective Cu diffusion barrier.

Figure 2:
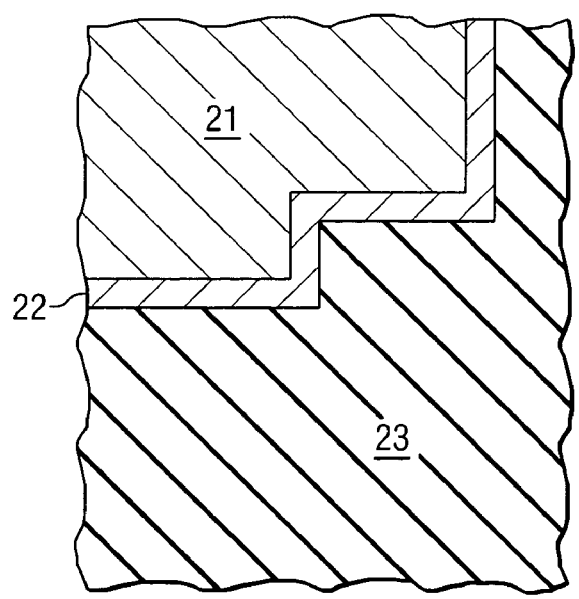
FIG. 2 illustrates the deposition of Ru/$RuO_2$, and it's use as a barrier material according to the present invention.
Figure 7:
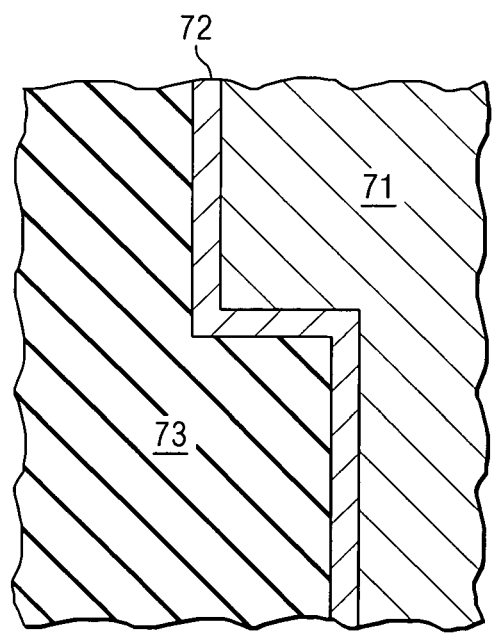
FIG. 7 illustrates the use of Ir/$IrO_2$ as a barrier material according to the present invention.

FIGS. 2 and 7 illustrate the use of more conductive barrier materials to replace Ta and TaN, according to the present invention. The barrier materials can be Ru and $RuO_2$ alone or in combination, Ir and $IrO_2$, alone or in combination, or the four in combination. As can be seen in FIG. 2, the Cu electrofill 21 is separated from the ILD 23 only by the $Ru/RuO_2$ combination layer 22. The use of these materials advantageously permits direct Cu electrofill without the need of an additional Cu seed layer. This advantageously provides better integration of the Cu in advanced IC chips with sub-micron features. Not shown in the Figure but within the scope of the present invention is the use of the barrier materials $Ru/RuO_2$ and $Ir/IrO_2$ in combination.

Figure 12:
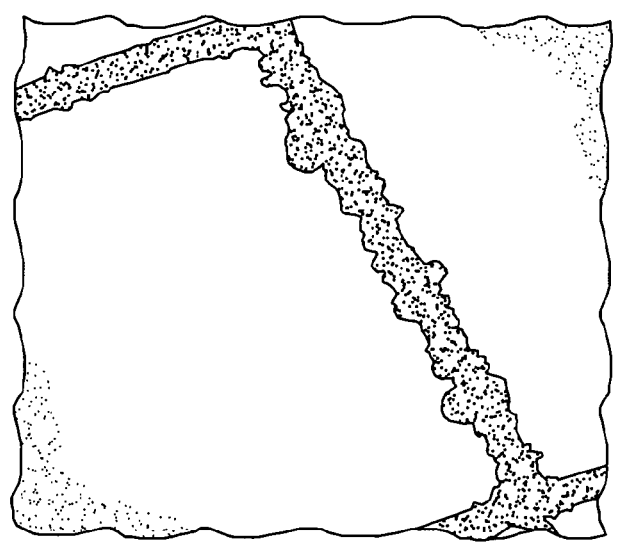
FIG. 12 is an optical image of an electroplated Cu film deposited on a (Ru, RuO2) barrier deposited on SiO$_2$ coated wafer after 500° C. annealing.

A strong adhesion between Cu/barrier/ILD is most critical if the fabricated Cu interconnect microstructures are to have sufficient mechanical strength to withstand the demanding chemical-mechanical planarization process currently used in IC fabrication. The present invention uses $Ru/RuO_2$ and $Ir/irO_2$, each alone or in combination, to achieve the stringent adhesion requirement. Cu adheres strongly on Ru, $RuO_2$, Ir and $IrO_2$ surfaces. More importantly, $RuO_2$ and $IrO_2$ can function as an adhesion layer to secure a Ru and/or $RuO_2$ and Ir, and/or $IrO_2$ barrier on various ILD materials. FIG. 12 demonstrates the excellent adhesion, confirmed by scribe and peel test, between Cu/(Ru, $RuO_2$)/SiO$_2$ even after annealing at 500° C. The present invention allows flexibility in fine adjusting (Ru, $RuO_2$) and (Ir, $IrO_2$) composite layer in the barrier design to achieve the optimum integration success.

Metal inter-diffusion will occur if mixing leads to a lowering of the free energy of interface. In a thin non-epitaxial metal film, grain boundaries and dislocations are abundant and, as a result, Cu diffusion through grain boundaries and dislocations are dominant, especially if the diffusion temperatures are low. In contrast to the resistive TaN barrier, $RuO_2$ and $IrO_2$ have a metal-like conductivity resulting from a partial filling of the metal and oxygen electronic band structure. The present invention utilizes the conductive $RuO_2$ and $IrO_2$ as "diffusion stuffers" to prevent the grain boundary diffusion of Cu into the nanometer scale Ru and Ir barrier layer. Oxygen impurities/stuffers are delivered to the more energetic grain boundaries and dislocations on the Ru surface by electrochemical, thermal oxidation, atomic layer deposition, and physical vapor deposition. Again, the relative location of $RuO_2$ and $IrO_2$ as "diffusion stuffers" can be freely adjust within the (Ru, $RuO_2$) and (Ir, $IrO_2$) composite layer in the barrier design to achieve the optimum integration success.

FIG. 3 is a graph illustrating the X-ray diffraction pattern of the Ru substrate before Cu is deposited.

FIG. 4 is a graph illustrating the X-ray diffraction pattern between the Cu electrofill deposit and the Ru substrate at 25 degrees Celsius. As seen therein, no new phases or intermetallic compound formation occurs between the Cu deposit and Ru substrate.

Further, as can be seen in FIG. 5, which is also a graph illustrating the X-ray diffraction pattern between the Cu deposit and the Ru substrate, no new phases or intermetallic compound formation occurs between the Cu deposit and Ru substrate even after annealing at 800° degrees Celsius. The chemical stability of the Cu/Ru interface under high thermal stress illustrates the advantages of Ru as an effective Cu diffusion barrier.

The X-ray diffusion data as shown in FIGS. 3, 4 and 5 also reveal favorable heteroepitaxial growth of Cu by electroplating on Ru with strong Cu(111) texture. Enhanced Cu(111) texture advantageously reduces defects at the interface and improves the electromigration reliability of the Cu interconnects.

Figure 6:
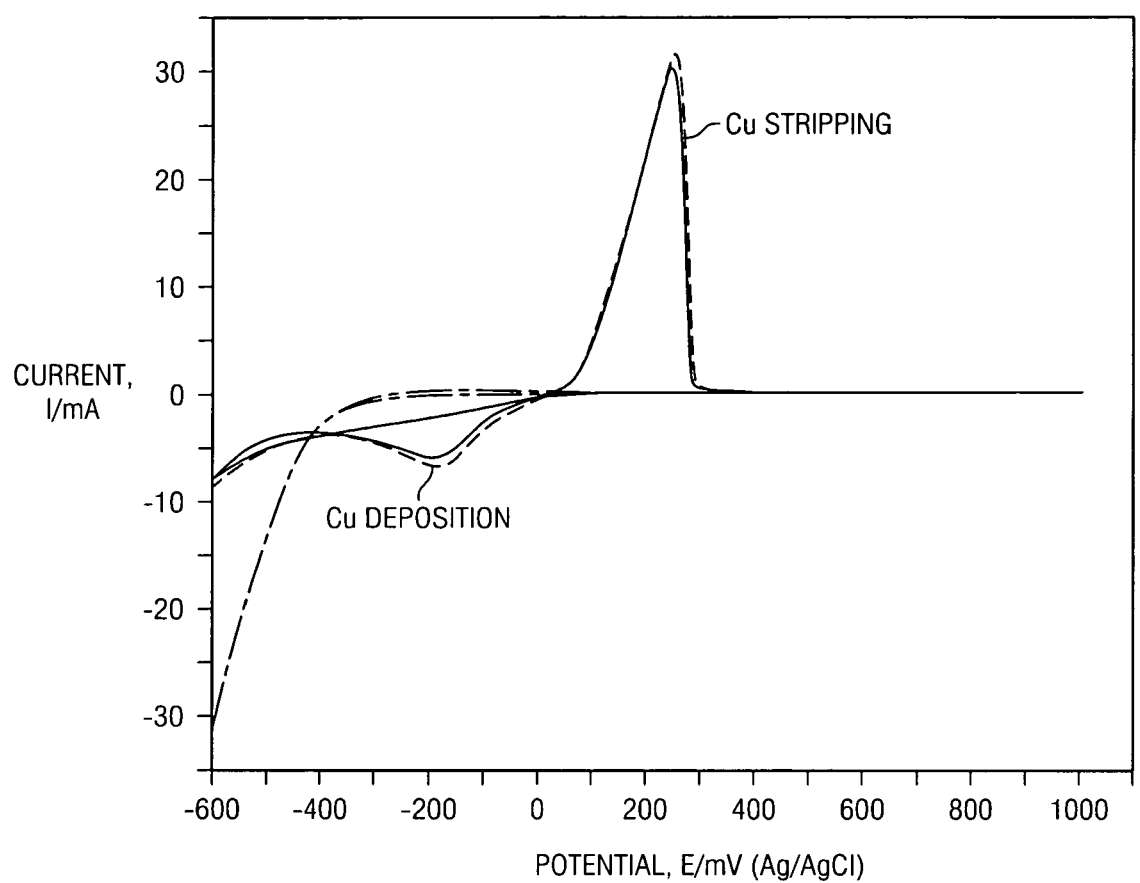
FIG. 6 is a graph illustrating the electroplating of Cu on the Ru substrate.

As can be seen in FIG. 6, the Cu plates easily to the Ru substrate and exhibits excellent adhesion thereon by a separate 3M tape test. Specifically, the adhesion was tested after the electroplating of the Cu on the Ru substrate from an acid sulfate bath. The plating bath comprised $CuSO_4$, and/or $H_2SO_4$. The plating techniques comprised linear sweep voltammetry and or Tungsten potential stepping. The plating efficiency was greater than 80% and the electrode configuration comprised an Ru disk or Ru coated silicon wafer working electrode with appropriate reference and counter electrodes.

As can be seen in FIG. 7, the Cu electrofill 71 is separated from the ILD 73 only by the $Ir/IrO_2$ combination layer 72. The use of these materials advantageously permits direct Cu electrofill without the need of an additional Cu seed layer. This advantageously provides better integration of the Cu in advanced IC chips with sub-micron features.

Figure 8:
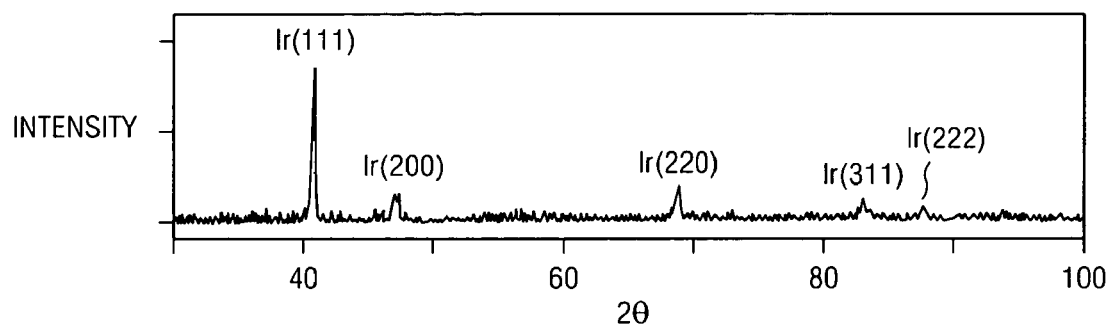
FIG. 8 is a graph illustrating the X-ray diffraction pattern of the Ir substrate.

FIG. 8 is a graph illustrating the X-ray diffraction pattern of the Ir substrate before the Cu is deposited.

Figure 9:
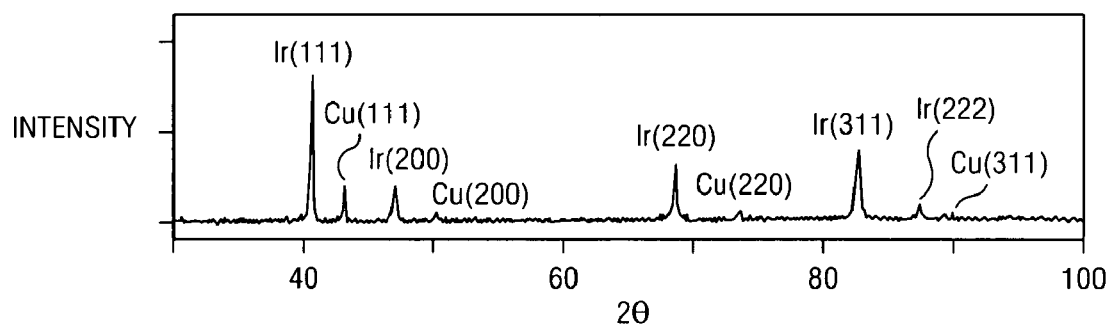
FIG. 9 is a graph illustrating the X-ray diffraction pattern between the Cu deposit and the Ir substrate at 25 degrees Celsius.

FIG. 9 is a graph illustrating the X-ray diffraction pattern between the Cu electrofill deposit and the Ir substrate at 25 degrees Celsius. As seen therein, no new phases or intermetallic compound formation occurs between the Cu deposit and Ir substrate.

Figure 10:
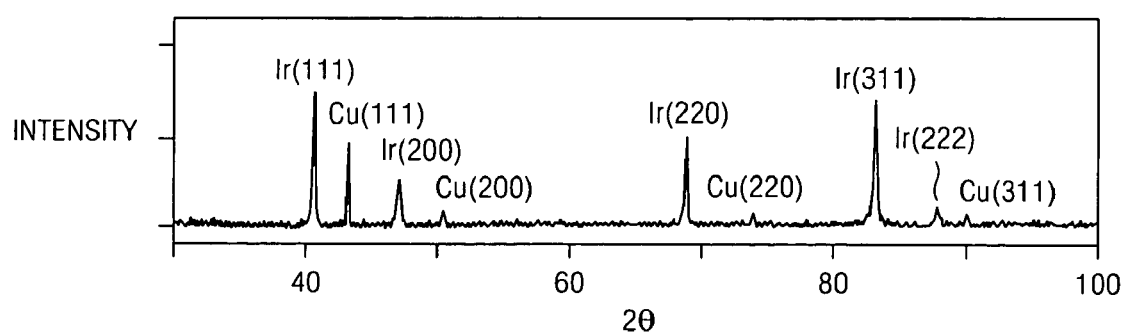
FIG. 10 is a graph illustrating the X-ray diffraction pattern between the Cu deposit and the Ir substrate at 600 degrees Celsius.

Further, as can be seen in FIG. 10, which is also a graph illustrating the X-ray diffraction pattern between the Cu deposit and the Ir substrate, no new phases or intermetallic compound formation occurs between the Cu deposit and Ir substrate even after annealing at 600° degrees Celsius. The chemical stability of the Cu/Ir interface under high thermal stress illustrates the advantages of Ir as an effective Cu diffusion barrier.

The X-ray diffusion data as shown in FIGS. 8, 9 and 10 also reveal favorable heteroepitaxial growth of Cu by electroplating on Ir with strong Cu(111) texture. Enhanced Cu(111) texture advantageously reduces defects at the interface and improves the electromigration reliability of the Cu interconnects.

Figure 11:
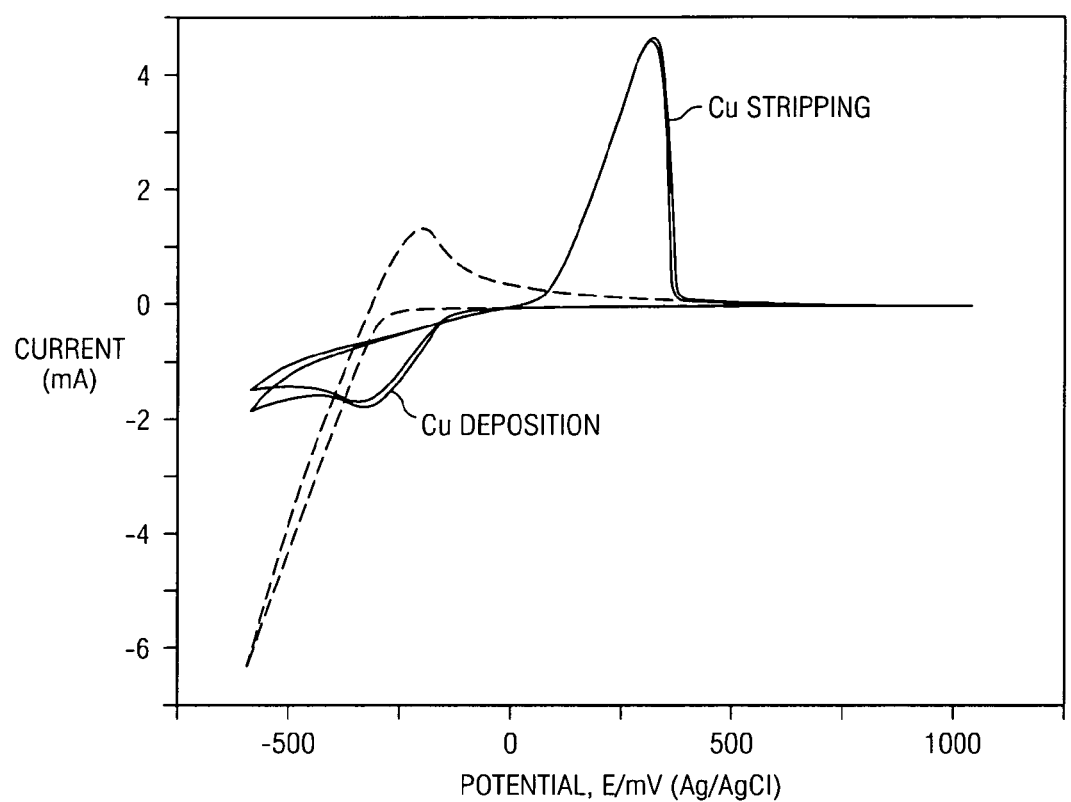
FIG. 11 is a graph illustrating the electroplating of the Cu on the Ir substrate.

As can be seen in FIG. 11, the Cu plates easily to the Ir substrate and also exhibits excellent adhesion thereon by a separate 3M tape test. Specifically, the adhesion was tested after the electroplating of the Cu on the Ir substrate from an acid sulfate bath.

FIG. 12 is an optical image of an electroplated Cu film deposited on a (Ru, RuO2) barrier deposited on $SiO_2$ coated wafer after 500° C. annealing. As can be seen, the Cu film remains intact along the edges of deep gouges after peel test by scotch tape clearly demonstrating the excellent adhesion between the plated Cu and (Ru, RuO2).

The innovative teachings of the present invention are described with particular reference to the disclosed embodiments. However, it should be understood that these embodiments provide only two examples of the many advantageous uses and innovative teachings herein. Various alterations, modifications and substitutions can be made to the disclosed invention without departing in any way from the spirit and scope of the invention. The invention covers ICs for use in any device or apparatus which is made with the materials described herein as a diffusion barrier.

What is claimed is:

1. A method of controlling and containing copper diffusion during the integration of copper interconnects during the fabrication of integrated circuits, comprising:
   preparing an inter-level dielectric substrate;
   depositing a layer of Ru on the inter-level dielectric substrate;
   depositing a layer of $RuO_2$ as a diffusion stuffer on the Ru layer;
   repeating the depositing of a layer of Ru and a layer of $RuO_2$ at least once; and
   depositing copper on the $RuO_2$ layer, wherein multiple layers of Ru and $RuO_2$ are deposited between the inter-level dielectric substrate and the copper layer.

2. The method of controlling and containing copper diffusion during the integration of copper interconnects during the fabrication of integrated circuits of claim 1, further comprising depositing the $RuO_2$ layer(s) on the Ru layer(s) using an atomic layer deposition technique.

3. The method of controlling and containing copper diffusion during the integration of copper interconnects during the fabrication of integrated circuits of claim 1, further comprising depositing the $RuO_2$ layer(s) on the Ru layer(s) using a thermal oxidation technique.

4. The method of controlling and containing copper diffusion during the integration of copper interconnects during the fabrication of integrated circuits of claim 1, further comprising depositing the $RuO_2$ layer(s) on the Ru layer(s) using an electrochemical technique.

5. The method of controlling and containing copper diffusion during the integration of copper interconnects during the fabrication of integrated circuits of claim 1, further comprising depositing the $RuO_2$ layer(s) on the Ru layer(s) using physical vapor deposition.

6. The method of controlling and containing copper diffusion during the integration of copper interconnects during the fabrication of integrated circuits of claim 1, further comprising depositing the $RuO_2$ layer on the Ru layer using an atomic layer deposition technique.

7. The method of controlling and containing copper diffusion during the integration of copper interconnects during the fabrication of integrated circuits of claim 1, further comprising depositing the $RuO_2$ layer on the Ru layer using a thermal oxidation technique.

8. The method of controlling and containing copper diffusion during the integration of copper interconnects during the fabrication of integrated circuits of claim 1, further comprising depositing the $RuO_2$ layer on the Ru layer using an electrochemical technique.

9. The method of controlling and containing copper diffusion during the integration of copper interconnects during the fabrication of integrated circuits of claim 1, further comprising depositing the $RuO_2$ layer on the Ru layer using physical vapor deposition.

* * * * *